(12) United States Patent
Mezghanni et al.

(10) Patent No.: US 11,893,687 B2
(45) Date of Patent: Feb. 6, 2024

(54) SEGMENTING A 3D MODELED OBJECT REPRESENTING A MECHANICAL ASSEMBLY

(71) Applicant: DASSAULT SYSTEMES, Velizy Villacoublay (FR)

(72) Inventors: Mariem Mezghanni, Vélizy-villacoublay (FR); Julien Boucher, Vélizy-villacoublay (FR); Paul Villedieu, Caluire (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 42 days.

(21) Appl. No.: 17/866,193

(22) Filed: Jul. 15, 2022

(65) Prior Publication Data
US 2023/0014934 A1    Jan. 19, 2023

(30) Foreign Application Priority Data

Jul. 16, 2021   (EP) .................................... 21306003

(51) Int. Cl.
| | |
|---|---|
| *G06T 17/10* | (2006.01) |
| *G06T 17/20* | (2006.01) |
| *G06F 30/12* | (2020.01) |
| *G06F 30/17* | (2020.01) |
| *G06F 30/27* | (2020.01) |

(52) U.S. Cl.
CPC .............. *G06T 17/10* (2013.01); *G06F 30/12* (2020.01); *G06F 30/17* (2020.01); *G06F 30/27* (2020.01); *G06T 17/20* (2013.01)

(58) Field of Classification Search
CPC ......... G06T 17/10; G06T 17/20; G06F 30/12; G06F 30/17; G06F 30/27

USPC ......................................................... 345/420
See application file for complete search history.

(56) References Cited

FOREIGN PATENT DOCUMENTS

| EP | 3 674 984 A1 | 7/2020 |
|---|---|---|
| EP | 3 675 061 A1 | 7/2020 |

OTHER PUBLICATIONS

Extended European Search Report dated Dec. 10, 2021, in European Application No. 21306003.1, 6 pages.
Luo, et al. ; Learning to Group: A Bottom-Up Framework for 3D Part Discovery in Unseen Categories ; Conference Paper at ICLR 2020 ; 23 Pages.

(Continued)

*Primary Examiner* — Jacinta M Crawford
(74) *Attorney, Agent, or Firm* — Oblon, McClelland, Maier & Neustadt, L.L.P.

(57) ABSTRACT

The disclosure relates to a computer-implemented method comprising inputting a representation of a 3D modeled object to an abstraction neural network which outputs a first set of a first number of first primitives fitting the 3D modeled object; and determining, from the first set, one or more second sets each of a respective second number of respective second primitives. The second number is lower than the first number. The determining includes initializing a third set of third primitives as the first set and performing one or more iterations, each comprising to merging one or more subsets of third primitives together each into one respective single fourth primitive, to thereby obtain a fourth set of fourth primitives. Each iteration further comprises setting the third set of a next iteration as the fourth set of a current iteration and setting the one or more second sets as one or more obtained fourth sets.

16 Claims, 9 Drawing Sheets

(56) References Cited

OTHER PUBLICATIONS

Ganapathi-Subramanian et al. ; Parsing Geometry Using Structure-Aware Shape Templates ; 3DV ; Sep. 5, 2018 ; 10 Pages.
Genova, et al. ; Learning Shape Templates with Structured Implicit Functions ; Apr. 12, 2019 ; 12 Pages.
Genova,, et al. ; Local Deep Implicit Functions for 3D Shape ; Jun. 12, 2020 ; 11 Pages.
Deng, et al. ; CvxNet: Learnable Convex Decomposition ; Apr. 12, 2020 ; 14 Pages.
Tulsiani, et al. ; Learning Shape Abstractions by Assembling Volumetric Primitives ; Aug. 2, 2018 ; 17 Pages.
Paschalidou, et al. ; Superquadrics Revisited: Learning 3D Shape Parsing beyond Cuboids Apr. 22, 2019 ; 21 Pages.
Sun, et al. ; Learning Adaptive Hierarchical Cuboid Abstractions of 3D Shape Collections ; ACM Trans. Graph, vol. 38, No. 6 ; Nov. 2019 ; 13 Pages.
Paschalidou, et al ; Learning Unsupervised Hierarchical Part Decomposition of 3D Objects from a Single RGB Image ; Apr. 2, 2020 ; 29 Pages.
Chang, et al. ; ShapeNet: An Information-Rich 3D Model Repository ; Dec. 9, 2015 ; 11 Pages.
Zvi Galil ; Efficient Algorithms for Finding Maximum Matching in Graphs ; Computing Surveys, vol. 18, No. 1 ; Mar. 1986 ; 16 Pages.
Gao, et al. ; Sparse Data Driven Mesh Deformation ; Sep. 5, 2017 ; 17 Pages.
Jaklic, et al. ; Segmentation and Recovery of Superquadrics ; Springer Netherlands 2000 ; Abstracts Only ; 25 Pages.
Qi, et al. ; PointNet: Deep Learning on Point Sets for 3D Classification and Segmentation ; Apr. 10, 2017 ; 19 Pages.

SEGMENTING A 3D MODELED OBJECT REPRESENTING A MECHANICAL ASSEMBLY

TECHNICAL FIELD

The disclosure relates to the field of computer programs and systems, and more specifically to methods, computer programs and devices for segmenting a 3D modeled object.

BACKGROUND

A number of systems and programs are offered on the market for the design, the engineering and the manufacturing of objects. CAD is an acronym for Computer-Aided Design, e.g., it relates to software solutions for designing an object. CAE is an acronym for Computer-Aided Engineering, e.g., it relates to software solutions for simulating the physical behavior of a future product. CAM is an acronym for Computer-Aided Manufacturing, e.g., it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Within this context and other contexts, segmenting a 3D modeled object, which may also be simply referred to as "3D segmentation" or "segmentation", is gaining wide importance.

Given a 3D modeled object (e.g., a mesh) representing a mechanical assembly, 3D segmentation generally may consist in splitting/partitioning geometrical portions (e.g., parts of the mechanical assembly) of the 3D modeled object into several connected clusters, called segments, where each segment maximizes its inner consistency, while minimizing its similarity with respect to the other segments. The result of the segmentation process may yield a partition of the parts of the mechanical assembly into several sets (the segments) in such a way that each segment represents a semantically consistent set with a clear border with respect to the other segments. A purpose of the 3D segmentation may be to take the 3D modeled object (e.g., the mesh of the 3D modeled object) as an input, and to decompose this input into several parts (e.g., by assigning each mesh vertex to a given part).

Recent work has focused on the application of deep neural networks to segment 3D modeled objects. In particular, the state of the art includes prior work that uses supervised deep learning methods to segment 3D shapes and prior work that uses unsupervised deep learning methods.

Among supervised methods, Luo et al. [1] propose a bottom-up method to perform scene and object segmentation. Ganapathi-Subramanian et al. [2] use a set of templates per object category to segment raw data captured by real-world sensors. More recently, Wang et al. [3] develop a pipeline to oversegment an object, and then merge the oversegmented patches together. These methods have one major drawback: the use of supervised learning does not allow the application of these methods to unlabeled and/or unseen object categories.

Several methods focused instead on unsupervised learning, using reconstruction losses to train various networks. Genova et al. [4] train a neural network to parameterize a set of gaussian functions to represent 3D shapes. They later improved the initial method in Genova et al. [5]. Both references focus mainly on geometrical accuracy. In the same category, Deng et al. [6] learns an autoencoder to decompose a 3D object into a set of convex parts. In contrast to the previous references, the main application is to use decomposition in real-time physics simulation. These works all output a fixed number of parts, which cannot lead to semantically relevant shape segmentations.

The state of the art also includes solutions that perform primitive abstraction, given a 3D shape. A first solution on the subject, by Tulsiani et al. [7], learns a network to represent 3D shapes with a set of cuboids. Paschalidou et al. [8] and Sun et al. [9] propose various improvements to this method. The first one adapts the loss to avoid the use of reinforcement learning, and uses superellipsoids as the basic primitive (instead of cuboids). The second one learns a network to predict several primitive abstractions with a different number of cuboids for each abstraction. The final shape abstraction is obtained by picking the best parts from each abstraction. Finally, Paschalidou et al. [10] introduce the notion of hierarchy, by iteratively decomposing the shape into two sub-parts, represented once again by superellipsoids. All these references have their own way to deal with the fact that different objects need a different number of primitives to represent them. However, none of them allows achieving efficiently an accurate and robust segmentation of a 3D modeled object with a reduced computation time.

Within this context, there is still a need for an improved method for segmenting a 3D modeled object representing a mechanical assembly.

CITED REFERENCES

[1] T. Luo, K. Mo, Z. Huang, J. Xu, S. Hu, L. Wang, H. Su, "LEARNING TO GROUP: A BOTTOM-UP FRAMEWORK FOR 3D PART DISCOVERY IN UNSEEN CATEGORIES" ICLR 2020

[2] V. Ganapathi-Subramanian, O. Diamanti, S. Pirk, C. Tang, M. Niessner, L. Guibas. "Parsing geometry using structure-aware shape templates" 3DV 2018

[3] X. Wang, X. Sun, X. Cao, K. Xu, B. Zhou, "Learning Fine-Grained Segmentation of 3D Shapes without Part Labels". CVPR 2021

[4] K. Genova, F. Cole, D. Vlasic, A. Sarna, W. Freeman, T. Funkhouser, "Learning Shape Templates with Structured Implicit Functions". ICCV 2019

[5] K. Genova, F. Cole, A. Sud, A. Sarna, T. Funkhouser, "Local Deep Implicit Functions for 3D Shape". CVPR 2020

[6] B. Deng, K. Genova, S. Yazdani, S. Bouaziz, G. Hinton, A. Tagliasacchi. "CvxNet: Learnable Convex Decomposition". CVPR 2020

[7] S. Tulsiani, H. Su, L. J. Guibas, A. Efros, J. Malik. "Learning Shape Abstractions by Assembling Volumetric Primitives". CVPR 2018

[8] D. Paschalidou, A. Osman, A. Geiger. "Superquadrics Revisited: Learning 3D Shape Parsing beyond Cuboids". CVPR 2019

[9] C. Sun, Q. Zou, X. Tong, Y. Liu. "Learning Adaptive Hierarchical Cuboid Abstractions of 3D Shape Collections". SIGGRAPH Asia 2019

[10] D. Paschalidou, L. van Gool, A. Geiger, "Learning Unsupervised Hierarchical Part Decomposition of 3D Objects from a Single RGB Image", CVPR 2020

[11] A. X. Chang et al., "ShapeNet: An Information-Rich 3D Model Repository," December 2015.

[12] Zvi Galli. "Efficient algorithms for finding maximum matching in graphs". In: ACM Comput. Surv. 18.1 (March 1986), pp. 23-38. ISSN: 0360-0300. DOI: 10.1145/6462. 6502. URL: https://doi.org/10.1145/6462.6502 (visited on Oct. 5, 2020)

[13] Lin Gao, Yu-Kun Lai, Jie Yang, Zhang Ling-Xiao, Shihong Xia, and Leif Kobbelt. Sparse data driven mesh deformation. IEEE transactions on visualization and computer graphics (2019)

[14] Ales Jaklic, Ales Leonardis, and F. Solina. Segmentation and Recovery of Superquadrics. en. Computational Imaging and Vision. Springer Netherlands, 2000. ISBN: 978-0-7923-6601-0. DOI: 10.1007/978-94-015-9456-1. URL: https://www.springer.conn/gp/book/9780792366010

[15] Charles R Qi, Hao Su, Kaichun Mo, and Leonidas J Guibas. Pointnet: Deep learning on point sets for 3d classification and segmentation. In Proceedings of the IEEE Conference on Computer Vision and Pattern Recognition, pp. 652-660, 2017a.

SUMMARY

It is therefore provided a computer-implemented method for segmenting a 3D modeled object representing a mechanical assembly. The method comprises providing the 3D modeled object. The method further comprises inputting a representation of the 3D modeled object to an abstraction neural network. The abstraction neural network outputs a first set of first primitives fitting the 3D modeled object. The first set consists of a first number of first primitives. The method further comprises determining, from the first set, one or more second sets each of respective second primitives. Each second set consists of a respective second number of respective second primitives. The second number is lower than the first number. The determining includes initializing a third set of third primitives as the first set. The determining further includes performing one or more iterations. Each iteration comprises providing the third set of third primitives. Each iteration also comprises merging one or more subsets of third primitives together each into one respective single fourth primitive. The iteration thereby obtains a fourth set of fourth primitives consisting of each single fourth primitive and each non-merged third primitive. Each iteration further comprises setting the third set of a next iteration as the fourth set of a current iteration. The determining further includes setting the one or more second sets as one or more obtained fourth sets.

The method may comprise one or more of the following:
the merging comprises determining the one or more subsets to be merged among a group of candidate subsets, said determining of the one or more subsets to be merged including, for each respective candidate subset of the group, a penalization of a merge cost of the respective candidate subset;
the merging comprises determining the group of candidate subsets among candidate groups of subsets, said determining of the group of candidate subsets including, for each respective candidate group, a global penalization, for all subsets of the respective candidate group, of merge compatibilities each between the third primitives of a respective subset;
the candidate groups of subsets consist of partitions of the third set each into pairs of third primitives, said determining of the group of candidate subsets including a minimum weight matching algorithm;
the abstraction neural network comprises:
an encoder, wherein the encoder comprises a convolutional neural network, and/or the encoder is configured to take voxel grids as input, the representation of the 3D modeled object inputted to the abstraction neural network being according to a voxel grid format, and
three sub-networks configured to respectively output primitive size parameters, primitive positioning parameters and primitive orientation parameters, and, one additional sub-network configured to output primitive shape parameters, wherein at least one sub-network is each composed of fully connected layers;
the one or more second sets comprise a plurality of second sets, the method further comprising one or more interactions each comprising:
selecting, upon user interaction, a single second set of the plurality of second sets; and
displaying, in real-time, a graphical representation of the selected second set;
the method further comprising:
automatically selecting a single fourth set, the selected single fourth set corresponding to an evolution of a merging reconstruction loss between successive iterations being higher than a threshold; and
marking the selected single fourth set;
the abstraction neural network is trained in an unsupervised manner on a dataset comprising non-annotated 3D modeled objects each representing a respective mechanical assembly;
the merging comprises inputting a representation of each subset to a merging neural network, the merging neural network outputting the respective single fourth primitive;
the merging neural network comprises:
an encoder, wherein the encoder comprises a convolutional neural network, and/or the encoder is configured to take voxel grids and/or point clouds as input, the representation of each subset inputted to the merging neural network being respectively according to a voxel grid format or to a point cloud format, and
three sub-networks respectively configured to respectively output primitive size parameters, primitive positioning parameters and primitive orientation parameters, and, one additional sub-network configured to output primitive shape parameters, wherein at least one sub-network is each composed of fully connected layers; and/or
at least one of the abstraction neural network and the merging neural network is trained based on a respective training loss which penalizes a reconstruction loss, wherein the reconstruction loss is based on point cloud distance, the training loss of the abstraction neural network further penalizes an overlap loss and an area loss, and/or the training loss is equal to a weighted sum of the reconstruction loss, the overlap loss and the area loss.

It is further provided a computer implemented method for learning the abstraction neural network and/or for learning the merging neural network. Any or both of the learning may be unsupervised, i.e., based on a non-annotated dataset.

It is further provided a computer program comprising instructions for performing the computer-implemented method for segmenting a 3D modeled object, the computer implemented method for learning the abstraction neural network and/or the computer implemented method for learning the merging neural network.

It is further provided a device comprising a data storage medium having recorded thereon the computer program.

The device may form or serve as a non-transitory computer-readable medium, for example on a SaaS (Software as a service) or other server, or a cloud based platform, or the like. The device may alternatively comprise a processor coupled to the data storage medium. The device may thus form a computer system in whole or in part (e.g., the device is a subsystem of the overall system). The system may further comprise a graphical user interface coupled to the processor.

BRIEF DESCRIPTION OF THE DRAWINGS

Non-limiting examples will now be described in reference to the accompanying drawings, where.

DETAILED DESCRIPTION

Figure 1:
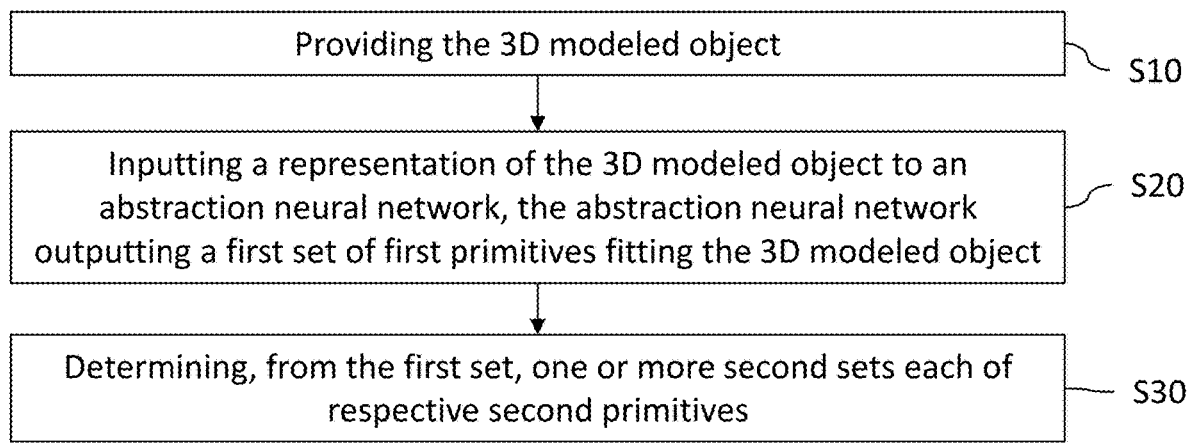
FIG. 1 shows a flowchart of an example of the method.

With reference to the flowchart of FIG. 1, it is proposed a computer-implemented method for segmenting a 3D modeled object representing a mechanical assembly. The method comprises providing S10 the 3D modeled object. The method further comprises inputting S20 a representation of the 3D modeled object to an abstraction neural network. The abstraction neural network outputs a first set of first primitives fitting the 3D modeled object. The first set consists of a first number of first primitives. The method further comprises determining S30, from the first set, one or more second sets each of respective second primitives. Each second set consists of a respective second number of respective second primitives. The second number is lower than the first number. The determining includes initializing a third set of third primitives as the first set. The determining further includes performing one or more iterations. Each iteration comprises providing the third set of third primitives, merging one or more subsets of third primitives together each into one respective single fourth primitive, thereby obtaining a fourth set of fourth primitives consisting of each single fourth primitive and each non-merged third primitive, and setting the third set of a next iteration as the fourth set of a current iteration. The determining further includes setting the one or more second sets as one or more obtained fourth sets.

This constitutes an improved method for segmenting a 3D modeled object representing a mechanical assembly.

By determining, first, a first set of first primitives, and then, iteratively merging subsets of primitives together, the method allows segmenting the 3D modeled object in a particularly relevant, robust and accurate way. The method starts with the output of the abstraction neural network, i.e., the first set of first primitives. This first set presents a higher granularity than the one or more second sets outputted by the iterative process. Indeed, the first number is strictly higher than the each of the respective second numbers. The first set can thus be seen as an over-segmentation of the 3D modeled object. Starting from this first over-segmentation allows segmenting the 3D modeled object in a precise way, i.e., by taking into account the fine geometrical features of the 3D modeled object.

Moreover, the method determines the one or more second sets based on an iterative process, which comprises, at each iteration, a merging of one or more subsets of primitives each into a new primitive. The iterative process therefore allows obtaining, at each iteration, a fourth set that is consistent with the fourth set obtained during the previous iteration. The merging allows to look at the geometry of the 3D modeled object locally, to recover coherence.

In addition, the method allows to reduce the learning bias. Indeed, the fact of starting from a first fine segmentation and then merging allows to better take into account the geometry of the mechanical assembly, which can be complex compared to the parts of the training dataset. Moreover, the method avoids multiplying the learning process. The fact of starting from an over-segmentation, and then merging subsets of primitives, allows to remain reasonable in computing time.

Segmenting a 3D modeled object herein means determining data that allows partitioning of the 3D modeled object into distinct parts called "segments". The method provides such data in the form of the one or more second sets of primitives that each fits the 3D modeled object. Each second set may form one segmentation, and each primitive of each second set may represent one segment.

The method may further comprise mapping portions of the 3D modeled object each to a respective primitive of at least one second set (e.g., each second set or a selected single second set), for example based on a distance from said portion to said respective primitive (e.g., portions of the 3D modeled object may be mapped to the closest primitive). The method may further comprise labelling the mapped portions accordingly. For example, for the at least one second set of primitives, the segmentation may comprise defining/instantiating a respective label for each primitive, and assigning portions of the 3D modeled object each to a respective label (i.e., marking each portion with the respective label). For example, the 3D modeled object may comprise a discrete geometrical representation (e.g., mesh or respectively point cloud), and the method may comprise assigning to a respective label each discrete element (e.g., mesh tile—such as a triangle in case of a triangular mesh—or respectively point). The assigning may be based on distance with the primitive corresponding to the respective label. For example, the method may assign portions of the 3D modeled object each to the closest primitive. The portion of the mechanical assembly may be a portion of a mesh that represents the mechanical assembly or a portion of a 3D CAD model that represents the mechanical assembly. Thus, the segments may each correspond to the different portions that have a same label.

The method determines several sets of primitives (the first, second, third and fourth sets). These different sets have a respective number of primitives, which may be higher or lower than the number of parts of the mechanical assembly. Thus, there may be no bijection between the primitives of a given set and the parts of the mechanical assembly. For instance, for a given set, one primitive may correspond to a single part, or, to several parts. Inversely, still considering a given set, a part of the mechanical assembly may correspond to a single primitive of the given set, or, to several primitives of the given set.

A mechanical assembly is an assembly of so-called mechanical "parts". A mechanical assembly consists of distinct pieces (i.e., parts) that form separate components and that are mechanically assembled together (e.g., via fixtures, press-fitting, snapping or soldering). The method may maximize inner consistency of each segment, while minimizing its similarity with respect to the other segments. Each segmentation is thus coherent with respect to the mechanical assembly, i.e., coherent with respect to the positioning/assembling of the parts/components in the mechanical assembly. For instance, each segmentation may be such that one of the following conditions is met by each given part of the mechanical assembly: (i) one or more segments fit the given part (i.e., substantially match the part), or (ii) one segment fits a group of parts including the given part. The segmentation may additionally be coherent with respect to the type of parts that the assembly comprises (e.g., main body parts, screws or legs). A mechanical assembly may be manufactured based on a process of putting together components (i.e., the parts of the mechanical assembly) on an assembly line. The borders of the segmentation (i.e., between the different segments) and of the mechanical assembly (i.e., between the different parts) are common.

A segmentation of the 3D modeled object provides an improved understanding and knowledge of the mechanical assembly that the 3D modeled object represents, and may further be of use in many manufacturing CAD applications (i.e., within a design and/or manufacturing process).

In a first application, the segmentation may be used for the manipulation or design of the 3D modeled object. Indeed, the segmentation may be used for modifying and/or moving segments of the 3D modeled object each as a whole. Additionally, the primitives are parameterized, and thus made editable with CAD tools by merely modifying primitive parameter values. By "parameterized", it is meant that the primitives are represented by a parametric equation or a parametric function, thus involving one or more parameters, wherein the one or more parameters may take values each in a respective continuous range. A 3D parameterized geometrical object allows an easy manipulation and/or editability and/or efficient storage in memory, as opposed to non-parameterized 3D geometrical objects such as discrete representations (e.g., point clouds, meshes, dexel representations). The first application may thus comprise editing parameters of one or more primitives by user-interaction, and automatically reflecting such editions on the respective segments of the 3D modeled object.

Alternatively or additionally, the first application may comprise identifying identical segments in different 3D modeled objects and/or several occurrences of a same segment in a same object. Then, the first application may comprise reorganizing data by storing, in a memory, a single segment for each of the identical segments (and/or for each of the several occurrences) and adding references to the identical segments (and/or to the several occurrences) instead of duplicating identical segments in the memory, in other words calling instances of the single objects in memory. This reorganization of the data may be carried out after the segmentation to obtain an efficient memory storage.

In a second application, the segmentation may be used for importing parts from a database into the 3D modeled object. For instance, the second application may comprise matching one or more segments with one or more parts from a database and replacing, in the 3D modeled object, the one or more segments with the one or more parts imported from the database that match the one or more segments. The one or more parts imported from the database may comprise additional information (e.g., a parametric representation, a name, a type of material or a specific manufacturing process). Thus, the importation of the parts from the database allows enriching the 3D modeled object.

In a third application, the segmentation may be used for building a library of parts. The library of parts may be consulted for re-using purpose of the parts in other mechanical assemblies. For instance, the third application may comprise adding the segments of the 3D modeled object to the library of parts and, during the design of another mechanical assembly, re-using one or more of the added segments in the another mechanical assembly.

In a fourth application of the method, the one or more segmentations yielded by the method may be used for re-meshing (i.e., if the provided 3D modeled object is a 3D mesh) or re-sampling (i.e., if the provided 3D modeled object is a 3D point cloud). This re-meshing/re-sampling may be used to denoise (e.g., removing outlier points, notably for a 3D point cloud, or smoothing the outer surface of the 3D modeled object, notably for a 3D mesh) the 3D modeled object. Additionally or alternatively, it may be used to divide efficiently a 3D mesh into several 3D meshes representing the mechanical assembly, i.e., to obtain a plurality of 3D meshes, each corresponding to a respective portion of the mechanical assembly. When the provided 3D modeled object is a 3D point cloud, the method may be used to divide the 3D point cloud with respect to the mechanical assembly. In this case, the method may be used to define to which part each point of the point cloud belongs.

In a fifth application of the method, the segmentation yielded by the method may be used for detecting anomalies in the 3D modeled object (e.g., manufacturing anomalies). This application may comprise comparing available knowledge of properties that the mechanical assembly should have with the segments of the segmentation outputted by the method, thereby yielding information about defects or anomalies in the mechanical assembly. For example, the available knowledge may comprise information such as "a given mechanical assembly should have six mechanical parts" or "usual parts should not have any small face portion". If the 3D modeled object which represents the mechanical assembly is segmented into a number of segments which does not correspond to six mechanical parts, or if some segments represent a small face portion (e.g., one primitive have parameters that represent a small face portion, the method may comprise deducting that the 3D modeled object features anomalies, such that the given assembly features anomalies (i.e., manufacturing defects).

Alternatively or additionally, the segmentation may be used in the fifth application to verify that certain criteria for a future manufacturing are respected, for instance a maximum size of each segment for 3D printing. The fifth application may comprise verifying that the segmentation segments the object into segments of a maximum size which are compatible with a machine in charge of the manufacturing.

In a sixth application, the segmentation may be used for automatically annotating datasets (into segmented objects). The annotated datasets may then be used, for instance, for learning tasks (e.g., discriminative or generative).

The segmentation outputted by the method may be used in other applications of 3D shape segmentation, for example 3D deformation, 3D rendering (geometric/material attributes computation, occlusion culling, shadow determination), 3D animation and/or shape compression. For instance, the method may be used for detecting objects in a 3D scene. The segmentation of 3D shapes may also be a first step towards the generation of a CAD trees for the 3D shapes, e.g., based on the segments.

Still referring to the flowchart of FIG. 1, the providing S10 of the 3D modeled object is now discussed. Prior to the discussion on the providing S10 of the 3D modeled object, data structures involved therein are now discussed.

The method is for segmenting a 3D modeled object, such that the method generally manipulates modeled objects. A modeled object is any object defined by data stored, e.g., in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems.

The 3D modeled object represents a mechanical assembly. By "3D modeled object", it is meant any object which is modeled by data allowing its 3D representation. A 3D representation allows the viewing of the mechanical assembly from all viewpoints (e.g., from various angles and/or distances). For example, a 3D modeled object, when 3D represented, may be handled, and turned around any of its axes, or around any axis in the screen on which the representation is displayed. This allows, e.g., inspecting the different parts of the mechanical assembly. This notably excludes 2D icons, which are not 3D modeled. The display of a 3D representation facilitates design (i.e., increases the speed at which designers statistically accomplish their task). This speeds up the manufacturing process in the industry, as the design of the products is part of the manufacturing process.

The 3D modeled object represents the geometry of a product (i.e., the mechanical assembly) to be manufactured in the real world subsequent to the completion of its virtual design with for instance a CAD software solution or CAD system. The 3D modeled object represents a mechanical assembly, which therefore comprises a plurality of parts. The manufacturing of the mechanical assembly may comprise a process consisting in putting together the parts of the mechanical assembly on an assembly line. A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object may thus represent an industrial product which may be any mechanical assembly, such as a terrestrial vehicle or a portion of a terrestrial vehicle (including, e.g., car and light truck equipment, racing cars, motorcycles, truck and motor equipment, trucks and buses, trains), an aerial vehicle or a part of an aerial vehicle (including, e.g., airframe equipment, aerospace equipment, propulsion equipment, defense products, airline equipment, space equipment), a naval vehicle or a part of a naval vehicle (including e.g., navy equipment, commercial ships, offshore equipment, yachts and workboats, marine equipment), a general mechanical assembly (including, e.g., industrial manufacturing machinery, heavy mobile machinery or equipment, installed equipment, industrial equipment product, fabricated metal product, tire manufacturing product), an electro-mechanical or electronic assembly (including, e.g., consumer electronics, security and/or control and/or instrumentation products, computing and communication equipment, semiconductors, medical devices and equipment), a consumer good (including, e.g., furniture, home and garden products, leisure goods, fashion products, hard goods retailers' products, soft goods retailers' products), a packaging (including, e.g., food and beverage and tobacco, beauty and personal care, household product packaging).

The provided 3D modeled object may form a discrete geometrical representation of the mechanical assembly. The discrete geometrical representation is herein a data structure which comprises a discrete set of pieces of data. Each piece of data represents a respective geometrical entity positioned in a 3D space. Each geometrical entity represents a respective location in the mechanical assembly (in other words, a respective portion of material constitutive of a solid represented by the 3D modeled object). The aggregation (i.e., union or juxtaposition) of the geometrical entities represents altogether the mechanical assembly. The discrete geometrical representation herein may in examples comprise a number of such pieces of data higher than 100, 1000, or 10000.

The discrete geometrical representation may for example be a 3D point cloud, each geometrical entity being a point. The discrete geometrical representation may alternatively be a 3D mesh, each geometrical entity being a mesh tile or face. The 3D mesh may be regular or irregular (i.e., consisting or not of faces of a same type). The 3D mesh may be a polygonal mesh, for example a triangular mesh. The 3D mesh may be obtained from a 3D point cloud, for example by triangulating the 3D point cloud (e.g., with a Delaunay triangulation). The 3D point cloud herein may be determined from physical measurements on the mechanical part, for example within a 3D reconstruction process. The 3D reconstruction process may comprise providing the mechanical assembly, providing one or more physical sensors each configured for acquiring a respective physical signal, and acquiring one or more respective physical signals by operating the one or more physical sensors on each of the parts of the mechanical assembly (i.e., scanning each part of the assembly with each sensor). The 3D reconstruction may then automatically determine a 3D point cloud and/or a 3D mesh based on the measurements, according to any known technique. The one or more sensors may comprise a plurality of (e.g., RGB, and/or image or video) cameras and the determination may comprise a structure-from-motion analysis. The one or more sensors may alternatively or additionally comprise one or more depth sensors (e.g., on an RGB-depth camera) and the determination may comprise a 3D reconstruction from depth data. The one or more depth sensors may for example comprise a laser (e.g., a lidar) or an ultrasound emitter-receiver.

The providing S10 of the 3D modeled object may comprise retrieving the 3D modeled object, e.g., from a (e.g., distant) database or memory where the 3D modeled object has been stored further to its creation or acquisition or obtention (e.g., through a reconstruction process as previously discussed). For example, the retrieving may comprise accessing the database or memory and downloading the 3D modeled object. Alternatively, the providing of the 3D modeled object may comprise performing physical measurements on the mechanical assembly and determining the 3D modeled object from the physical measurements, for example through a 3D reconstruction process as previously discussed. The providing of the 3D modeled object may alternatively comprise creating, e.g., by a user, the 3D modeled object, e.g., by sketching it.

Still referring to the flowchart of FIG. 1, further to the providing S10 of the 3D modeled object, the method comprises a first segmentation S20 performed by an abstraction neural network. The abstraction neural network is any neural network which takes as input a representation of the 3D modeled object and outputs a first set of primitives. The neural network is called an "abstraction" neural network in reference to its capacity to abstract the initial representation of the 3D modeled object into a set of primitives. The first set of primitives is a set of primitives that fits the inputted representation of the 3D modeled object, which means that the set of primitives defines a spatial distribution that reproduces the spatial distribution of the 3D modeled object. Each of the first primitive represents a respective portion of the 3D modeled object, i.e., a respective portion of the mechanical assembly.

The first set consists of a first number of first primitives, and the first number may be predetermined (i.e., same value whichever the input of the abstraction neural network). For instance, the first number may be a number that is higher than the number of parts of the mechanical assembly, e.g., greater than twice the number of parts, or three times. This allows achieving a first fine segmentation (over-segmentation) of the 3D modeled object. In examples, the first number may be a default value, e.g., 32, or a value chosen by a user. For instance, the user may wish to segment a predetermined set of mechanical assemblies and the first number be chosen large enough such that every mechanical assembly in the predetermined set may be represented accurately enough by the first set of primitives. The method may store the outputted first set of primitives, e.g., in a memory.

The abstraction neural network is a neural network which has been trained on a dataset of 3D objects (e.g., meshes or point clouds) to output a set of primitives that fits an inputted representation of a 3D modeled object. During the training, the abstraction neural network learns to infer primitive abstraction of a given shape representation in the form of a set of primitives.

The method manipulates sets of primitives (i.e., the first, second, third or fourth set of, respectively, first, second, third or fourth primitives). A primitive is a geometrical shape that is completely determined from a finite number of parameters, for example below 100 or 50 or 15 parameters. Each parameter may be an integer value or a real value (e.g., numerically represented by a floating point). Each primitive considered in the method delimits a portion of material of the mechanical assembly. This delimitation is the geometrical shape constituting the primitive. Thus, each of the determined primitive represents a respective portion of material of the mechanical assembly. Determining a primitive therefore means determining each parameter of the primitive. Primitive parameters may comprise parameters representing the size of the primitive (size parameters), parameters representing the positioning of the primitive (primitive positioning parameters) and parameters representing the orientation of the primitive (primitive orientation parameters). Primitive parameters may also comprise parameters representing the shape of the primitive (primitive shape parameters). In examples, the primitives may comprise one or more cuboids. Alternatively or additionally, the primitives may comprise one or more superellipsoids.

Still referring to the flowchart of FIG. 1, further to the first segmentation S20, the method comprises determining S30, from the first set, one or more second sets each of respective second primitives. Each second set consists of a respective second number of respective second primitives. The number of primitives of each second set (i.e., each second number) is lower than the first number. Indeed, the second sets are computed based on an iterative process which merges, at each iteration, one or more subsets of primitives. Each second set has a respective number of primitives. For instance, each second set can have its own number of primitives, i.e., different from those of the other second sets.

The iterative process is now discussed in more details. The determining S30 includes initializing a third set of third primitives as the first set. The third set is used by the method to perform the iterative process. In particular, the third set is used to consider, initially at each iteration (i.e., to start with), the set obtained at a previous iteration. To initialize the third set, the method may point to a location where the first set is stored in the memory. Alternatively, the method may copy the first set in a memory location dedicated to the third set.

After the initialization, the determining S30 includes performing one or more iterations, each iteration allowing to obtain a respective fourth set. Each iteration comprises providing the third set of third primitives. For the first iteration, the provided third set is the initialized third set, and, for each subsequent iteration, the third set is the fourth set obtained at the previous iteration. Each iteration further comprises merging one or more subsets of third primitives together each into one respective single fourth primitive. Merging is an operation that replaces a subset of primitives with a single unique primitive (i.e., a single fourth primitive). This unique primitive comes from a merge of the primitives of the subset, which means that this unique primitive fits the primitives of the subset. The merging thus allows reducing the number of primitives while minimizing the induced loss of geometric information. The merging may compute, for a given subset of primitives, a single primitive that best minimizes this loss of geometric information (i.e., the single primitive that fits the subset of primitives). The merging may thus take as input a subset of primitives and output a single primitive representing the subset of primitives. Alternatively, the merging may output several primitives. The merging may compute several subsets of primitives and may compute, for each subset, a respective single primitive (i.e., the merging may output one single primitive for each inputted subset of primitives). The computing of the merging may be parallelized (e.g., one calculation for each subset). Alternatively, the computing of the merging of each subset may be performed successively.

The fourth set consists of each single fourth primitive (i.e., one fourth primitive for each merged subset) and each non-merged third primitive (i.e., the third primitives that are not comprised in the one or more subsets). The fourth set therefore amounts to the third set, up to the primitives of each merged subset being replaced with a single primitive. Each iteration further comprises setting (i.e., fixing/determining) the third set of a next iteration as the fourth set of a current iteration. In other words, the fourth set of a given iteration becomes the third set of the subsequent iteration. The method may, e.g., replace in the memory the primitive parameters of each merged subset with the parameters of the computed single fourth primitive. At each iteration, the memory size of the third set thus decreases and the number of primitives of the third set is reduced.

After the one or more iterations, the determining S30 includes setting (i.e., fixing/determining) the one or more second sets as one or more obtained fourth sets. In other words, the one or more second sets are determined to be the one or more fourth sets obtained throughout the iteration(s). The method may, e.g., store the one or more obtained fourth sets in the memory and set the one or more second sets by pointing to the location of one or more of the obtained fourth sets in the memory. Alternatively, the method may copy one or more of the obtained fourth sets. In examples, the determining S30 may perform one single iteration. In this case, a single fourth set is obtained, and the second set is the obtained single fourth set. In another examples, the method may perform two iterations, thereby obtaining two fourth sets. In this case, the method may set the second set as one of the two obtained fourth sets, or, alternatively, may set two second set as the two obtained fourth sets. In another examples, the method may perform three iterations, and the method may set one, two or three second sets as respectively any one of the three obtained fourth sets, any two of the obtained fourth sets (e.g., the first and the last obtained fourth sets) or the three of the obtained fourth sets. It is understood that the method may perform any number n of iterations, and set any number m of second sets, the number m being lower than or equal to the number n of iterations. For instance, the method may set a number of second sets substantially twice lower than the number of fourth sets, e.g., by selecting fourth sets obtained successively after one iteration out of two successive, or for one iteration out of three successive, or for one iteration out of a number i of successive iterations (i being a positive integer).

At each iteration, one or more subsets of third primitives are merged together each into one respective single fourth primitive. Merging a subset of primitives means putting together the primitives of the subset in one primitive, i.e., forming a single primitive that represents the primitives of the subset (i.e., which is a merge of the primitives of the subset). The single primitive fits the subset, i.e., represents the spatial distribution that the union of the primitives of the subsets represents. Merging, at each iteration, one or more subsets of third primitives means that, at each iteration, the number of primitives of the obtained fourth set is lower than the number of primitives of the provided third set. Consequently, the number of primitives of the obtained fourth set is successively reduced at each iteration. Thus, the one or more second sets (that are set as one or more obtained fourth sets) may be ordered by a decreasing (or, alternatively, an increasing) number of primitives, each second set having its own distinct number of primitives. Thus, the method allows providing efficiently, and in a robust way, one or more segmentations of the 3D modeled object, each of the provided segmentations being finer or coarser than the others.

The merging may comprise determining the one or more subsets to be merged among a group of candidate subsets. The candidate subsets are unordered sets of n elements (here, the elements are the third primitives). Each candidate subset may comprise, e.g., two third primitives (a pair of third primitives) or three third primitives. The candidate subsets of the group may have different numbers of primitives. Some candidate subsets may comprise two third primitives and some other candidate subsets may comprise a number greater than two of third primitives. Alternatively, each candidate subset of the group may have a same number of primitives (e.g., two or three third primitives). In this case, the one or more subsets to be merged have also the same number of primitives. Each third primitive may be comprised in a candidate subset. Each candidate subsets comprises two or more third primitives. Thus, a part of the third primitives may be comprised in one of the candidate subsets of the group. Alternatively, each of the third primitives may be comprised in one or more respective candidate subsets of the group. For instance, each third primitives may be comprised in exactly one candidate subset of the group. In this case, the group of candidate subsets forms a partition of the third primitives. The group of candidate subsets is a partition of the third set of third primitives if the union of the candidate subsets is equal to the third set and the candidate subsets are two by two disjoint.

Said determining of the one or more subsets to be merged may include, for each respective candidate subset of the group, a penalization of a merge cost of the respective candidate subset. The one or more subsets to be merged may be the one or more candidate subsets having the lowest merge cost. The one or more subsets to be merged may be the one or more candidate subsets having a merge cost lower than a threshold. Alternatively, the one or more subsets to be merged may be, given a number n of candidate subsets, the n candidate subsets with the lowest merger cost among the candidate subsets. In this case, the method may e.g., execute an algorithm which comprises computing a merge cost for each of the candidate subsets, ordering the candidate subsets by increasing merge cost and determining the one or more subsets to be merged by selecting the n one or more subsets having the lowest merge costs. Other algorithms may be used to determine the one or more subsets, in particular algorithms that allow determining the one or more subsets that minimize the merge costs without computing a merge cost for each of the candidate subsets. The merge cost is a quantity that qualifies a cost to merge two or more primitives, i.e., an effort to put together these two or more primitives. Merging a subset of primitives may be forming a single primitive that represents the primitives of the subset (i.e., the spatial distribution of the union of the primitives of the subset). The loss may thus correspond to an extent of a difference or disparity between the spatial distribution that the single primitive represents and the spatial distribution of the union of the primitives of the subset. The greater the difference, the higher the merge cost may be. The merge cost of a subset may therefore quantify a loss of geometrical information when the primitives of the subsets are merged. This allows achieving accurate one or more segmentations of the 3D modeled object.

The merging may comprise determining the group of candidate subsets among partitions of the third set each into pairs of third primitives. In this case, the subsets are distinct pairs of third primitive. Each partition may thus be considered as a set of edges between pairs of third primitives. The determining of the group of candidate subsets may include a minimum weight matching algorithm. Given real or integer edge weights (or costs), the minimum weight matching algorithm comprises computing a matching (i.e., a partition) which minimizes a summation of its associated edge weights. The minimum weight matching thus allows determining the partition that minimizes the summation of edge weights. The weight of a given edge (or pair) may e.g., be based on distances between the third primitives of the given pair. The determined partition may thus be the partition that minimizes the distances between the pairs. The distance may e.g., be a geometrical distance between the two primitives of each pair, e.g., between their outer surfaces, or between their centers.

Thus, the minimum weight matching algorithm selects the partition that minimizes among candidate partitions a global penalization, for all subsets of the respective candidate group, of distances each between the third primitives of a respective subset. Other algorithms may be used to select a partition among candidate partitions that minimize a global penalization. The method is not limited to partitions of the third set each into pairs. The method may consider partitions of the third set each into subsets of three third primitives, or subsets of any number n of third primitives. A specific algorithm may be used depending on the considered partitions.

More generally, the method may consider any group of subsets of the third primitives. Thus, the merging may comprise determining the group of candidate subsets among candidate groups of subsets. Said determining of the group of candidate subsets may include, for each respective candidate group, a global penalization, for all subsets of the respective candidate group, of merge compatibilities. The merge compatibilities may be any quantities qualifying the suitability of the merge. The merge compatibilities may be a distance, such as a geometrical distance. The merge compatibilities may be a difference between principal axis, notably in the case of superellipsoids.

The abstraction neural network may comprise an encoder. An encoder is a component that transforms the inputted 3D modeled object into a code. The encoder may thus depend on the format of the inputted 3D modeled object. Optionally, the encoder may comprise a convolutional neural network (CNN). Additionally or alternatively, the encoder may be configured to take voxel grids as input. The representation of the 3D modeled object inputted to the abstraction neural network may be according to a voxel grid format.

The abstraction neural network may also comprise three sub-networks configured to respectively output primitive size parameters, primitive positioning to parameters and primitive orientation parameters. Optionally, the abstraction neural network may further comprise one additional sub-network configured to output primitive shape parameters. Optionally, at least one sub-network may be each composed of fully connected layers. For instance, each sub-network may be composed of respective fully connected layers. The respective fully connected layers may have output sizes depending on the first number and on a number of respective outputted parameters. Additionally or alternatively, the first number (i.e., the number of primitives of the first set) may be a hyperparameter.

The one or more second sets may comprise a plurality of second sets, e.g., two or more second sets. In this case, the method may further comprise one or more interactions each comprising:
 selecting, upon user interaction, a single second set of the plurality of second sets; and
 displaying, in real-time, a graphical representation of the selected second set.

The one or more interactions may be performed via a user-interaction tool executed by the method. The method may, e.g., comprise one interaction. The selection may be performed based on a slide bar. The slide bar (or track bar) is a graphical control element with which a user may set a value by moving an indicator, e.g., horizontally. The values that the user may set may correspond to each of the second sets. By setting a value, the user may thus select one of the second set. The user may thus set the value by moving the indicator. Alternatively, the user may also directly click on a point on the slide bar to set a value. The graphical representation of the selected second set may be displayed close to the slide bar, e.g., above the slide bar. At each successive interaction, the graphical representation displayed at the previous interaction may be replaced by a new graphical representation. The user may thus navigate among the second sets. For instance, the user may navigate among each of the fourth sets.

The method may further comprise automatically selecting a single fourth set. The selected single fourth set may correspond to an evolution of a merging reconstruction loss between successive iterations being higher than a threshold. The method may further comprise marking the selected single fourth set. In a first option, the one or more second sets may be the single marked selected fourth set. In other words, there is only one second set, which is the single marked selected fourth set. In a second option, there are several second sets, and the single marked selected fourth set is one of the second sets. In this second option, the user may navigate among the second sets via a slide bar and the value of the slide bar corresponding to the single marked selected fourth set may be highlighted. The method may thus automatically mark a predicted optimal second set.

The abstraction neural network may be trained in an unsupervised manner on a dataset comprising non-annotated 3D modeled objects each representing a respective mechanical assembly. For the unsupervised training, the 3D modeled objects of the dataset may be pre-processed to be used as both input of the network and ground truth for the training loss.

The merging may comprise inputting a representation of each subset to a merging neural network. The merging neural network may output the respective single fourth primitive.

The merging neural network may comprise an encoder. Optionally, the encoder may comprise a convolutional neural network. Alternatively or additionally, the encoder may be configured to take voxel grids or point clouds as input. The encoder may also be configured to take both voxel grids and point clouds as input. The merging neural network may take as input a voxel grid format. Alternatively or additionally, the merging neural network may take as input a point cloud format.

The merging neural network may also comprise three sub-networks configured to respectively output primitive size parameters, primitive positioning parameters and primitive orientation parameters. Optionally, the merging neural network may also comprise one additional sub-network configured to output primitive shape parameters. Optionally, at least one sub-network may be each composed of fully connected layers. For instance, each sub-network may be composed of respective fully connected layers. The respective fully connected layers may have output sizes depending on respective outputted parameters of each sub-networks.

At least one of the abstraction neural network and the merging neural network may be trained based on a respective training loss. The respective training loss may penalize a reconstruction loss. Both the abstraction neural network and the merging neural network may, e.g., be trained based on a respective training loss. Optionally, the reconstruction loss may be based on point cloud distance. The training loss of the abstraction neural network may further penalize an overlap loss and an area loss. Alternatively or additionally, the training loss may be equal to a weighted sum of the reconstruction loss, the overlap loss and the area loss.

Implementations of the method are now discussed.

Some prerequisites are first introduced.

Deep Neural Networks (DNNs): They are a powerful set of techniques for learning in Neural Networks which is a biologically-inspired programming paradigm enabling a computer to learn from observational data. In image recognition, the success of DNNs is attributed to their ability to learn rich midlevel media representations as opposed to hand-designed low-level features (e.g., Zernike moments, HOG, Bag-of-Words or SIFT) used in other image categorization methods (e.g., SVM, Boosting or Random Forest). More specifically, DNNs are focused on end-to-end learning based on raw data. In other words, they move away from feature engineering to a maximal extent possible, by accomplishing an end-to-end optimization starting with raw features and ending in labels.

Superellipsoids: In mathematics, a superellipsoid (also referred to "superellipsoid") is a solid that is parameterized by a set of eleven parameters. Superellipsoids as computer graphics primitives were popularized by Alan H. Barr (who used the name "superquadrics" to refer to both superellipsoids and supertoroids). However, while some superellipsoids are superquadrics, neither family is contained in the other. The selection of these types of primitives, as well as how exactly they are parameterized, is discussed later.

Primitive: The term "primitive" is used in the geometrical sense: a primitive is a geometrical solid, parameterized by a set of parameters. Examples of primitives include cuboids and superellipsoids.

Primitive Abstraction: refers to assembling objects using geometric primitives.

Over-refined primitive abstraction: refers to a primitive abstraction where the number of primitives is higher than the optimal number of primitives. The optimal number of primitives may be a user's input. Alternatively, the optimal number of primitives may be automatically determined.

Merging: Merging primitives means computing an optimal single primitive that represents the original set of primitives and replacing the input set of primitives by this single primitive. The optimality may be reflected by the geometric distance between the input primitives and the output one.

Unsupervised learning is a type of machine learning that looks for previously undetected patterns in a data set with no pre-existing labels and with no human annotation, in contrast to supervised learning that usually makes use of human-labeled data.

Voxel grids: Voxel grids are the 3D equivalent of pixel grids: they are 3D regular grids, with two possible values in each voxel: full or empty.

The method may implement a framework, which is decomposed in two stages: an offline stage and an online stage. In the offline stage, the method comprises training two neural networks independently (a first neural network and a second neural network). This offline stage is transparent to the user. The first neural network (also referred to as "initial abstraction network") is learnt on a dataset of 3D objects. The first neural network learns to output the parameters of a set of primitives that best represents the 3D object by minimizing a reconstruction loss between the 3D object and the set of primitives. The result is an over-refined primitive abstraction. The second neural network is learnt on a dataset where each instance of the dataset is a set of parameters describing primitives. The second neural network learns to output the parameters of a single primitive that best represents the set of primitives given as the input.

The online stage comprises three steps. In a first step, given a provided 3D object, the method uses the initial abstraction network to obtain a first over-refined primitive abstraction. In a second step, given this initial abstraction, the method applies an iterative algorithm to simplify the abstraction. This algorithm is composed of two main steps:

Selecting the optimal set of primitives to merge; and
Merging them, i.e., replacing these primitives by one new primitive.

The algorithm therefore computes one or more sets of primitives, each of these sets corresponding to a given segmentation of the provided 3D object.

In a third step, once the merging algorithm is done, the method either allows a user to select a desired number of primitives for the final abstraction, and/or the method determines in an automatic manner an optimal abstraction. The method thus allows selecting or automatically determining a given segmentation among the one or more segmentations of the provided 3D modeled object.

The implementations are now presented in more details. First, the two stages of the framework are discussed. Then, implementation details are given. Finally, several qualitative results are illustrated.

Figure 2:
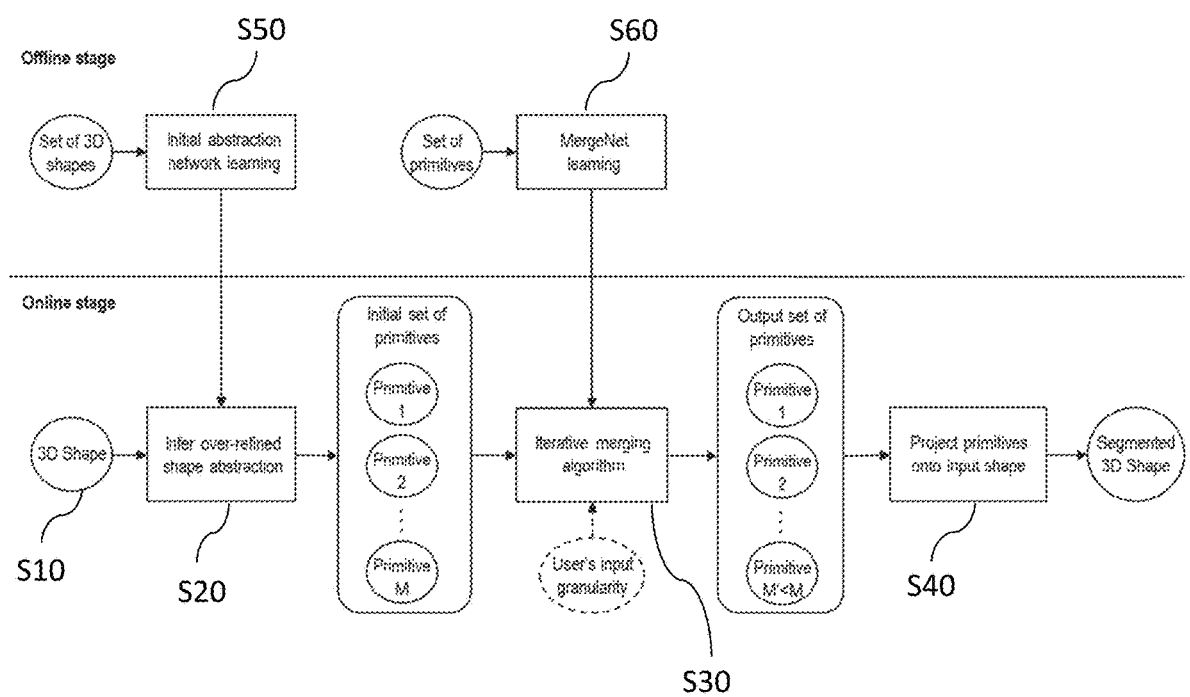
FIG. 2 shows a flowchart of an example of the framework.

With reference to the flowchart of FIG. 2, the two stages of the framework that the method may implement are discussed.

As mentioned above, the offline stage comprises learning two separate neural networks (S50 and S60). The learning of the first neural network S50 (also referred to as "initial abstraction network") is now discussed. The initial abstraction network is trained S50 on a dataset of 3D objects, i.e., a set of 3D shapes (e.g., meshes or point clouds), for instance as in [11]. The initial abstraction network learns to infer primitive abstraction of a given shape representation in the form of a set of primitive parameters. The method may comprise pre-processing the 3D objects to be used as both input of the network and ground truth for the training loss (unsupervised training). The input may be a voxel grid (using a 3D CNN encoder), a point cloud (using a point cloud encoder, e.g., PointNet [15]), or a mesh (using for instance the encoder described in [13]). In the discussed implementations, the method uses a 3D voxel grid encoder as the input to the initial abstraction network and uses a point cloud as the ground truth for the reconstruction loss. In other implementations, the method may use the same format for the input to the initial abstraction network and for the ground truth for the reconstruction loss, e.g., a point cloud format. The voxel grid format is relevant for two reasons. Firstly, the voxel grid format allows obtaining a coarse resolution which may be sufficient because surface details may not be required. Secondly, the voxel grid allows to get rid of the noise of a real scan (e.g., lidar), which provides locally different densities (indeed, voxels may have discrete values, such as 0 or 1). Alternatively, the method may denoise the point cloud.

The learning of the second neural network S60 is now discussed. The second neural network is learnt on a dataset of sets of primitives. As a training pattern, each set may be associated with one single primitive (i.e., the result of the merge of the primitive of the set). The single primitive may be a point cloud, e.g., calculated from the primitives of the set to be merged. Such a point cloud may be computed directly and therefore may not be included in the dataset. In the discussed implementations, the method generates such a dataset in a synthetic manner by picking primitives from the abstractions inferred by the first network. Another way to obtain such a dataset may be to generate one from scratch in a procedural manner.

In the training pattern, each set of primitives may be pre-processed as follows. First, the method may use the parameters of the primitives to sample points on the surface of these primitives. The method may use the obtained point cloud as the ground truth for a reconstruction loss. The reconstruction loss for the training of the second neural network may be different to the reconstruction loss of the first neural network. To obtain the input to the second neural network, the method may compute a convex hull of this point cloud, and resample points on this convex hull. A convex hull is the smallest convex shape enclosing the point cloud. A property of the convex hull is that the subset of extreme points of the point cloud belong to the convex hull surface. The subset of the extreme points is thus very sparse and therefore not sufficient. The number of points of the convex hull may be higher than 100, e.g., may be 1000, which allows obtaining a regular shape. Computing a convex hull and then resampling improves the result (i.e., gives a better result, more precise) than simply computing a point cloud on the set of primitives. Finally, the method may voxelize this point cloud (i.e., convert the point cloud in a voxel grid format). The voxelization may have a resolution having a given number of voxels in each direction, e.g., 32 (i.e., a resolution of 32×32×32). Each voxel may have a binary value (e.g., 0 or 1) based on the presence or not of point in the voxel.

This pre-processing (successively through point cloud, convex hull, resampling and voxelization) gives optimal results. The method is not limited to this pre-processing. Other implementations of the method may include skipping the resampling on the convex hull, using the points sampled on the primitives to merge with no pre-processing at all and/or using the parameters of the set of primitives as the input. An added benefit is that the second neural network can merge an arbitrary number of primitives together (and thus, even when using the parameters of the set of primitives as the input). For instance, the second neural network can merge subsets of two primitives or subsets of three primitives.

The online stage is now discussed. As previously explained, the online stage comprises three steps that are now discussed in more details.

The first step is the initial primitive abstraction S20, which is an initial step of the online stage. The initial primitive abstraction consists in taking an input (which may be either a mesh or a point cloud), e.g., entered by a user, converting it to a network's input format (e.g., a voxel format) and feeding it to the initial abstraction network. The initial abstraction network outputs an initial primitive abstraction, which consists in a first set of primitives. More specifically, the initial abstraction network may output a set of parameters that describe each primitive of the first set. The initial abstraction network may be configured to output a fixed number of primitives (i.e., the number of primitives of the first set may be predetermined).

The second step S30 is a simplification of the initial abstraction. To this end, the method applies an iterative merging algorithm, which simplifies, at each iteration, the initial abstraction. The merging algorithm is applied to obtain an abstraction having fewer primitives. This specific implementation uses a version of the merging algorithm in which the number of primitives is decreased one by one at each iteration. Other versions of the merging algorithm may be implemented. For instance, other versions of the merging algorithm can merge an arbitrary number of primitives at each iteration (e.g., by simply selecting to merge the $N_s$ pairs with the lowest merging cost at iteration s, $N_s$ being equal or inferior to the number of primitives at iteration s of the iterative process).

Figure 3:
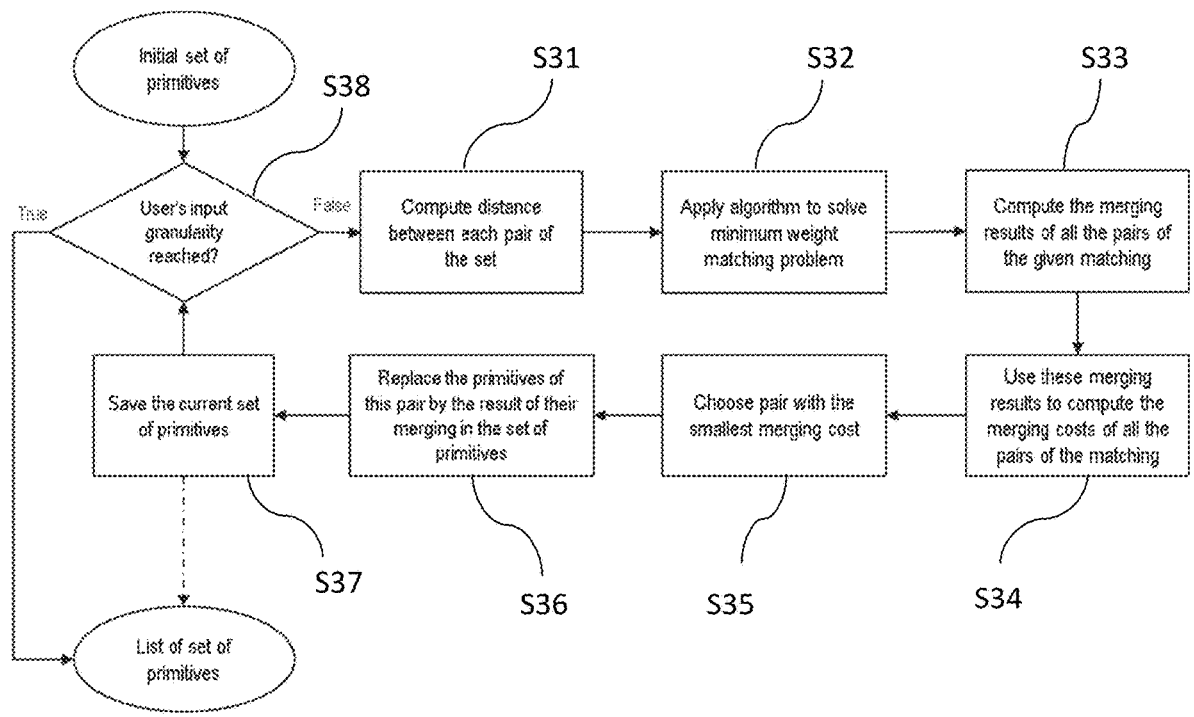
FIG. 3 a flowchart of an example of the merging algorithm.

With reference to the flowchart of FIG. 3, the second step S30 of FIG. 2 is now discussed in more details. As mentioned previously, the merging algorithm consists in iteration of two mains steps: selecting the primitives to merge and merging them together. The selection of the primitives to merge itself may comprise two sub-steps.

In a first sub-step, the method computes a matching of all the primitives of the abstraction (i.e., the method may group primitives by pairs of possible mergings). To do so, the method may first compute a distance S31 between pairs of primitives, for all primitives in the abstraction. In the discussed implementations, the method samples a set of points on each primitive and applies the chamfer distance between sets of points to compute the distance between two primitives. In other implementation, the distance may be an earth mover's distance between sets of sampled points, a Euclidian distance between the centers of primitives or a weighted sum of all previously mentioned distances. Once the inter-primitive distances are computed, the method treats the problem as one of minimum weight matching and applies S32 an algorithm to obtain the desired matching, e.g., an algorithm such as one from [12] (referred to as Blossom algorithm). The minimum weight matching algorithm selects the partition that minimizes among candidate partitions a global penalization, for all subsets of the respective candidate group, of distances each between the third primitives of a respective subset.

In a second sub-step, once the matching is done, the method computes the merging results S33 of all the pairs of the desired matching, computes a merging cost S34 for each pair based on the merging results and decides to merge S35 the pair with the smallest merging cost. To compute the merging cost S34 of a given pair of primitives, the method uses the ground truth used for the reconstruction loss of the first neural network, i.e., the set of points sampled on the input shape. The method then computes a difference between the current reconstruction loss (i.e., the reconstruction loss with a current set of primitives) and a potential reconstruction loss, which is the reconstruction loss when the method replaces the pair of primitives considered by the result of their merging (i.e., a single primitive). The method uses this difference as the merging cost. To compute all the merging costs, the method infers the mergings of all the primitive pairs from the matching (i.e., computes said difference for all pairs).

Once the method decides S35 which pair of primitives to merge, the method replaces S36 the two primitives of the pair by the result of their merging and iterates the whole process. For instance, the method may iterate the process until a user's input granularity is reached S38. The user granularity may, e.g., be a number of primitives. The method also saves S37 the result of each iteration of the algorithm, i.e., saves all the intermediary primitive abstractions. Saving the result of each iteration allows having a real-time display of the intermediary primitive abstractions during the selection of one or them.

Still in step S30, once the merging algorithm is done, the method has a list of primitive abstractions, each abstraction having a different number of primitives (one abstraction for each iteration). At this time, the method sets a given set of primitives as one abstraction among the obtained list of primitive abstractions (i.e., selects a final abstraction). To perform this selection of the final abstraction, a first option is to allow the user to review the different abstractions and choose the one that best fits his/her intentions. A second option is to automate the process. To do so, the method monitors the evolution of the reconstruction loss during the merging process.

Figure 4:
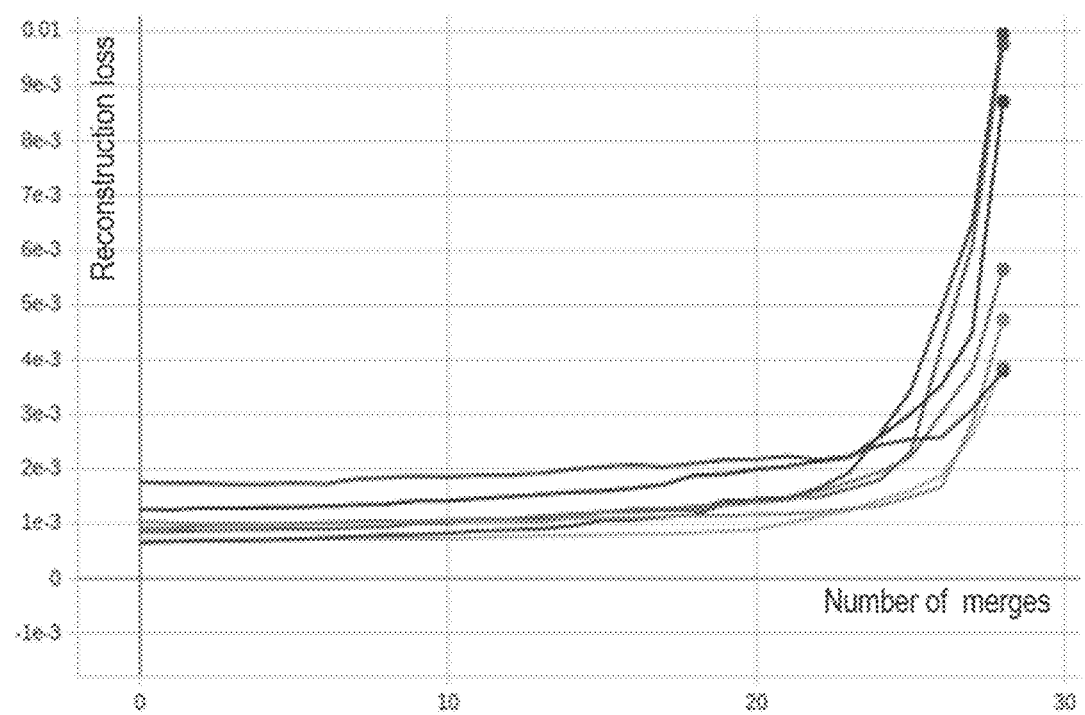
FIG. 4 shows an example of evolution of the reconstruction loss during the merging algorithm.

FIG. 4 shows examples of this evolution. The method may automate the choice of the final abstraction by using the evolution of this reconstruction loss. An example of how to select the final abstraction based on the evolution of the reconstruction loss is now given. Let n be the number of iterations in the merging process. Let $0<i<n$. Let $C_i$ be the value of the reconstruction loss of the $i^{th}$ primitive abstraction. The method may select as the final abstraction the abstraction corresponding to the iteration i for which $C_{i+1} - C_i > k$, wherein k is a predetermined threshold (e.g., k=2).

Once the final abstraction has been selected, the method comprises projecting the primitives of the final abstraction into the 3D modeled object. This final step is a labelling step which consists of labelling shape parts with corresponding primitives. The correspondence may be computed by attributing to each element of the 3D modeled object (e.g., each point when the inputted object is a point cloud, or each vertex when the inputted object is a mesh) an index of its closest primitive. The method may choose, as a metric, the proximity of primitive surface. The method therefore allows obtaining a segmented 3D modeled object with a desired user granularity.

More implementation details are now discussed. Among other things, the minimization of losses during the trainings is discussed.

In the discussed implementations, the method uses superellipsoids as the choice of primitives for primitive abstraction. This type of primitive provides a good trade-off between representational power and number of parameters. Other types of primitives can be considered (e.g., cuboids or star domains). Superellpsoids allow achieving stable losses. The star domain allows even more flexibility than the superellipsoid, which improves performance and how closely the abstraction approaches the object through abstraction (i.e., the representation power).

Superellpsoids may be parameterized using a set of eleven parameters. The superellipsoids are defined based on an explicit superquadric equation, which defines the surface vector r in the following way:

$$r(\theta, \phi) = \begin{bmatrix} \alpha_1 \cos(\varepsilon_1)\theta\cos(\varepsilon_2)\varphi \\ \alpha_2\cos(\varepsilon_1)\theta\sin(\varepsilon_2)\varphi \\ \alpha_3\sin(\varepsilon_1)\varphi \end{bmatrix}, \begin{array}{c} \theta \in \left[-\frac{\pi}{2}, \frac{\pi}{2}\right] \\ \varphi \in [-\pi, \pi] \end{array}$$

where $\alpha=[\alpha_1, \alpha_2, \alpha_3]$ represent the size parameters (positive real values) and $\varepsilon=[\varepsilon_1, \varepsilon_2]$ represent the shape parameters (each between 0 and 2).

Figure 5:
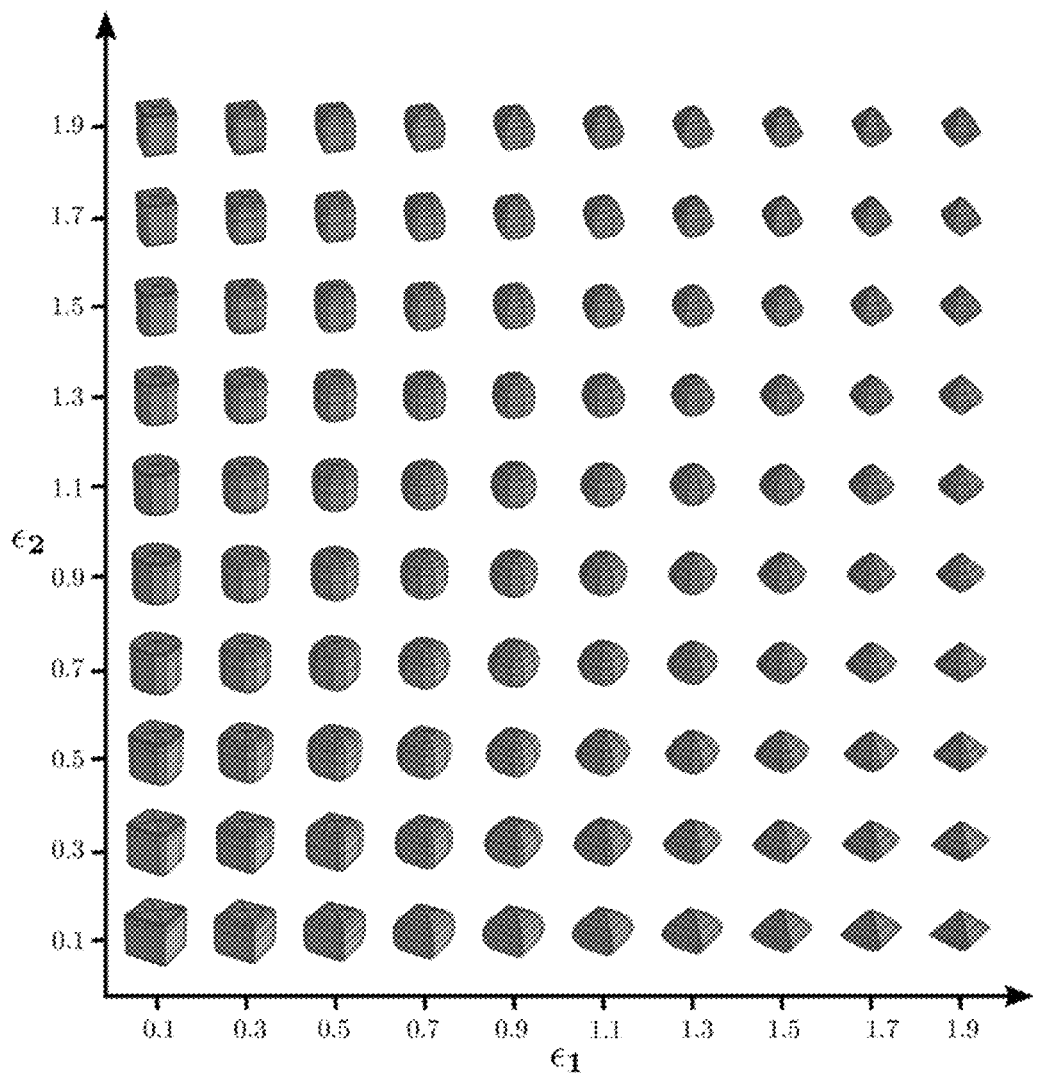
FIG. 5 shows an example of variations of superellipsoid shape with respect to the shape parameters.

FIG. 5 illustrates how the shape parameters $\varepsilon_1$, and $\varepsilon_2$ modify the shape of superellipsoids ([8]). The equation produces a superellipsoid centered in the origin and aligned on the axis. The primitive parameterization may be completed with a translation vector to represent the position (based on three parameters) and Euler's angles to represent the orientation (based also on three parameters). The method may also use quaternions or axis-angle representation to represent the orientation.

The initial abstraction model is now discussed. First, an example architecture of the initial abstraction neural network is detailed.

Figure 6:
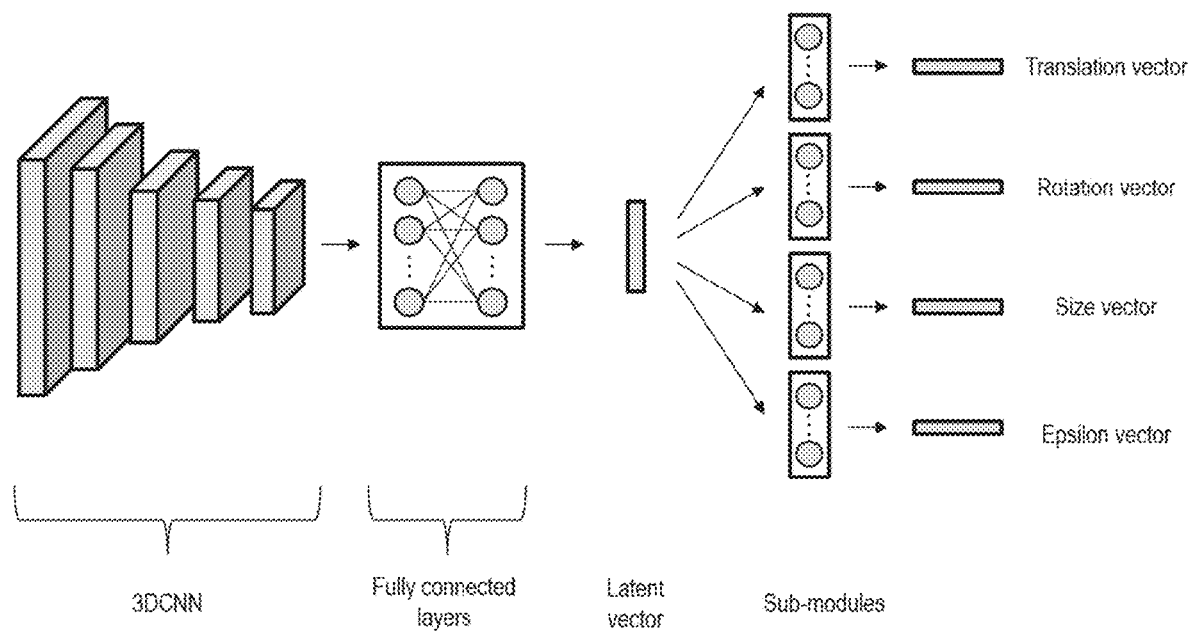
FIG. 6 shows an example of architecture of the initial abstraction model.

FIG. 6 shows an example of architecture of the initial abstraction model.

The initial abstraction network consists of an encoder and several following sub-networks. This encoder may depend on the input, as indicated earlier. In this example, the method uses voxel grids as the input. The voxel grid is passed through successive layers of a convolutional neural network. The voxel grid may be passed through at least one of successions of convolution, possible batch normalization, activation function (e.g., such as ReLu, leaky ReLu, Tanh) and pooling (e.g., Max-pooling and/or Mean-pooling). Then, the voxel grid is passed through fully connected layers to extract a latent vector. This vector is then fed to four sub-networks that respectively determine size parameters of the primitives, positioning parameters of the primitives, orientation parameters of the primitives and shape parameters $\varepsilon=[\varepsilon_1, \varepsilon_2]$ of the primitives. For instance, the initial abstraction network may comprise fourt modules (one for each sub-networks) that respectively determine size parameters, positioning parameters, orientation parameters and shape parameters. The number of modules that the initial abstraction network comprises may depend on the type of primitive. For instance, one or more additional useful modules may be added to network, or one or more useless modules may be removed (e.g., the shape module may be removed in the case of cuboid primitives instead of superellipsoid primitives). These sub-networks are composed of fully connected layers, with output sizes depending on the specific parameters outputted (e.g., M×3 for a size sub-network, M×3 for a translation sub-network, M×2 for the shape sub-network and so on, with M being the number of primitives outputted by the initial abstraction network).

The training of the initial abstraction network is now discussed. The initial abstraction network allows obtaining an abstraction of primitives as close as possible to the provided 3D modeled object. Different losses that may be implemented for the training process are now detailed.

A first training loss may be a reconstruction loss. The reconstruction loss uses the Chamfer distance to measure the discrepancy between the computed primitive assembling and the input shape. The reconstruction loss may be formulated as follows. A set of N points sampled from an input shape surface (to be processed) is denoted by $X=\{x_i\}_{i=1}^N$. A set of K points sampled from each inferred primitive m surface is denoted by $Y=\{Y_m\}_m=\{\{y_k^m\}_{k=1}^K\}_{m=1 \ldots M}$. The reconstruction loss may be formulated by:

$$L_{recon}(Y, X) = L_{Y \to X}(Y, X) L_{X \to Y}(X, Y)$$

wherein $L_{Y \to X}$ measures the distance from the predicted primitives Y to the point cloud X and $L_{X \to Y}$ measures the distance from the point cloud X to the primitives Y.

The detailed expressions of the two losses may be formulated as follows.

$$L_{Y \to X}(Y, X) = \frac{1}{M}\sum_{m=1}^{M}\frac{1}{K}\sum_{k=1}^{K}\Delta_k^m; L_{X \to Y}(X, Y) = \sum_{x_i \in X}\sum_{m=1}^{M}\Delta_i^m$$

wherein $$\Delta_k^m = \min_{i=1,\ldots,N}\|T_m(x_i) - y_k^m\|_2$$

$$\Delta_i^m = \min_{k=1,\ldots,K}\|T_m(x_i) - y_k^m\|_2$$

$\Delta_k^m$ denotes a minimal distance from the $k^{th}$ point $y_k^m$ on the $m^{th}$ primitive to the target point cloud X, while $\Delta_i^m$ designs a minimal distance from point $x_i$ to the surface of the m$^{th}$ primitive. Here, $T_m$ is a function that transforms a 3D point $x_i$ in world coordinates into the local coordinate system of the m$^{th}$ primitive.

A second training loss may be an overlapping loss. This second training loss is a regularization which penalizes overlap between primitives. This second training loss thus avoids overlap, which allows obtaining a decomposition of the object (without parts of an object that overlaps). The structure of the object is therefore clearly segmented. As an added benefit, this regularization encourages a more equal distribution of primitives in the different parts of the object. The method may be adapted to use superquadrics by making use of the inside-outside function of a superquadric S given in [14]:

$$F_S(x, y, z) = \left(\left(\frac{x}{\alpha_1}\right)^{\frac{2}{\epsilon_2}} + \left(\frac{y}{\alpha_2}\right)^{\frac{2}{\epsilon_2}}\right)^{\frac{\epsilon_2}{\epsilon_1}} + \left(\frac{z}{\alpha_3}\right)^{\frac{2}{\epsilon_1}}$$

The parameters $\alpha_1$, $\alpha_2$, $\alpha_3$ and $\epsilon_1, \epsilon_2$ are the same as the ones of the explicit superquadric equation. $F_S$ provides a simple way to test whether a given point (x,y,z) lies inside or outside the superquadric S. If F<1, the point is inside the S, if F=1, the point lies on the surface of S, and if F>1 the point lies outside the S.

To penalize primitive overlapping, the method proceeds with sampling points inside and on the surface of our set of primitives, and then penalizes points belonging to a given primitive that lies inside another primitive. The overlapping loss may be formalized as follows:

$$L_{overlap}(Y) = \sum_{Y_m \in Y} \sum_{y_k^m \in Y_m} \sum_{p \in [1;M], p \neq m} \max(1 - F_p(y_k^m), 0)$$

A third training loss may be an area homogeneity loss. The area homogeneity loss is a regularization which encourages a homogeneous distribution of the dimensions of the superquadrics inferred by the network by controlling their total surfaces. Combining this regularization with the regularization of overlapping allows keeping a uniform density with a relevant level of detail over the entire volume of the object. To implement the area homogeneity loss, the method may use the following Knud Thomsen's formula, which allows determining a surface area of an ellipsoid and thus approximating the surface area of a superquadric S:

$$\text{Area}(S) = 4\pi \left(\frac{\alpha_1^p \alpha_2^p + \alpha_1^p \alpha_3^p + \alpha_2^p \alpha_3^p}{3}\right)^{\frac{1}{p}}$$

wherein the method may use p≈1.6075, which gives a relative error of approximately 1.061%. To make the network infer superquadrics with a similar surface area, the method may enforce the following loss:

$$L_{area}(Y) = \sqrt{\frac{1}{M} \sum_{Y_m \in Y} \left(\text{Area}(Y_m) - \frac{1}{M} \sum_{Y_m \in Y} \text{Area}(Y_m)\right)^2}$$

The area homogeneity loss L area penalizes the standard deviation of the distribution of superquadric surfaces inferred. This tends to encourage the model to standardize the surfaces around a learned average.

Examples of losses have been detailed. The method is not limited to these examples of losses and may be implemented with other losses for the training. The method may be implemented with a single loss. Alternatively, the method may be implemented with any combination of losses. For instance, the model may be trained using a weighted sum of the defined losses, by using the following formula:

$$L_{train} = L_{recon} + \alpha L_{overlap} + \beta L_{area}$$

wherein $\alpha$ and $\beta$ are weighting positive scalars.

The merging neural network (the second neural network) is now discussed. The merging neural network comprises a voxel grid encoder, followed by several sub-networks. A difference with the initial abstraction network is in the output dimensions of the sub-networks. Because the merging neural network outputs the parameters of a single primitive, the output dimensions of each sub-network are adapted (1×3 for the size sub-network, 1×2 for the shape sub-network, and so on).

The encoder of the merging neural network may be adapted to take point clouds as an input (e.g., PointNet, such as in [15]). In this example, the merging neural network has a 3D voxel grid encoder, but the presented solution is not limited to a 3D voxel grid encoder. The merging neural network may be trained using a reconstruction loss, such as the reconstruction loss $L_{recon}$ described above with M=1.

Figure 7:
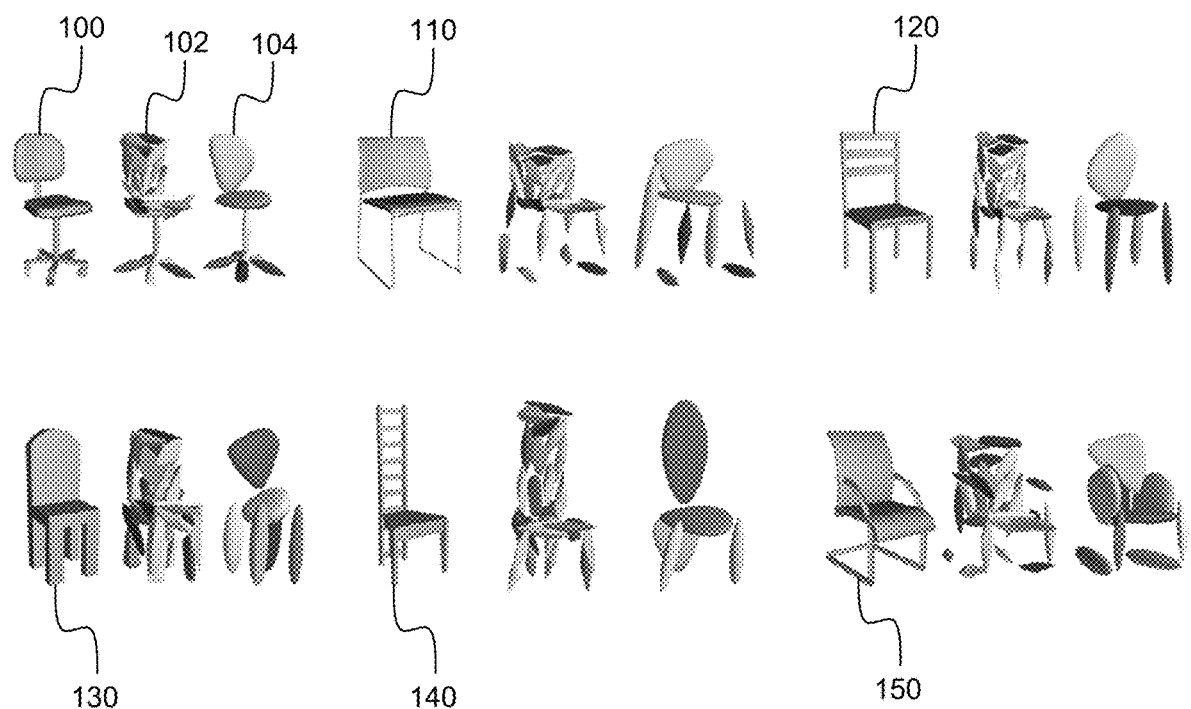
FIG. 7 shows an example of parsimonious abstraction with the iterative process.
Figure 8:
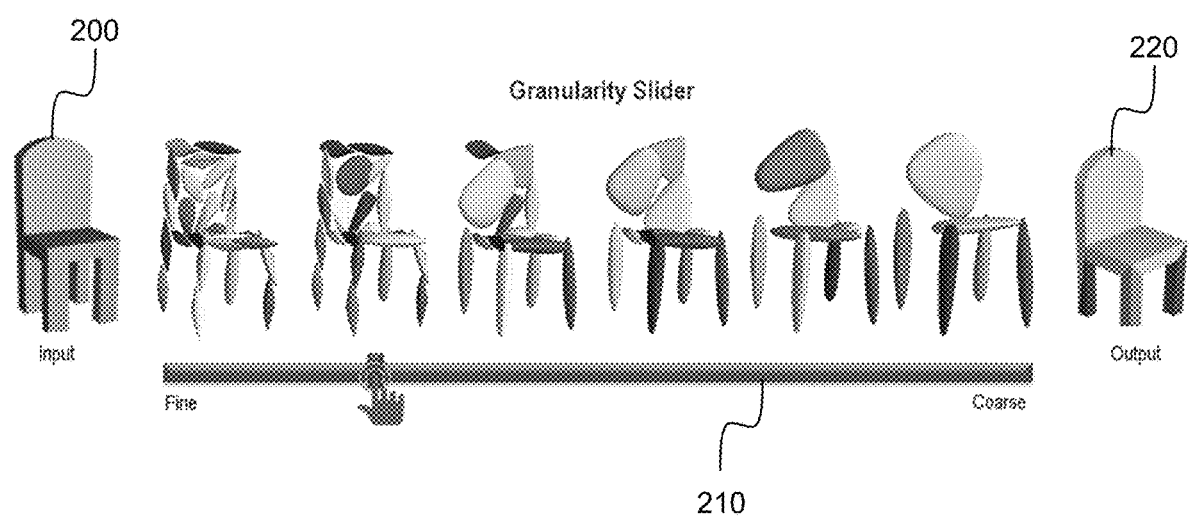
FIG. 8 shows an example of interactive shape abstraction.

With reference to FIGS. 7 and 8, qualitative results of the method are now discussed. FIGS. 7 and 8 illustrate several examples of obtained results. FIG. 7 shows six inference examples obtained for six different chairs 100, 110, 120, 130, 140 and 150. FIG. 7 illustrates the six examples with three pictures corresponding to, from left to right: the 3D modeled object of the chair, the computed initial set of primitives 102 (i.e., the initial abstraction before merging) and the final set of primitives 104 (i.e., the final abstraction after merging). The six examples shows that the initial set of primitives 102 gives a uniform and regular representation of the input shape, while the obtained set of primitives after merging (i.e., the final abstraction) reflects a fine decomposition of the input shape. Moreover, the obtained decomposition is semantically meaningful: the method decomposes the shape the same way a human would.

FIG. 8 illustrates an example of a user-interaction tool executed by the method. The user-interaction tool allows a user to select a desired granularity level that controls the number of iterations performed at the merging algorithm step. By doing this, the method allows the user to control the exact number of parts desired in the final segmentation. The object considered in this example is a chair, represented by the 3D modeled object 200. The user-interaction tool comprises a granularity slider 210. The granularity slider 210 allows the user to set a value by moving an indicator horizontally. The values that the user set correspond to each of the computed sets of primitive (i.e., the sets of primitives computed iteratively by the first and second neural networks, from the first fine abstraction to the final coarse abstraction). By setting a value of the slider 210, the user selects one of these computed sets. The user sets the value by moving the indicator. Alternatively, the user may also directly click on a point on the slide bar to set a value. As illustrated in FIG. 8, the user-interaction tool may display a graphical representation of each of the computed sets above the slide bar, at their respective slider values. This display allows the use to select one of the computed sets efficiently. Alternatively, the user-interaction tool may display only a graphical representation of a single set corresponding to a currently selected set. The graphical representation of the currently selected set may be displayed close to the slide bar, e.g., above the slide bar. After each new successive interaction of the user with the slider, the graphical representation displayed at a previous interaction may be replaced by a new graphical representation corresponding to a newly selected set. The user can thus navigate among the computed sets.

As illustrated in FIG. 8, user-interaction tool may also display the labelled 3D modeled object 220, i.e., the 3D modeled object after the projection of the primitives of the final abstraction into the 3D modeled object. Each part of the mechanical assembly identified by the method may therefore be highlighted, e.g., using a different color for each of the identified part.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g., one for the program, and possibly one for the database).

Figure 9:
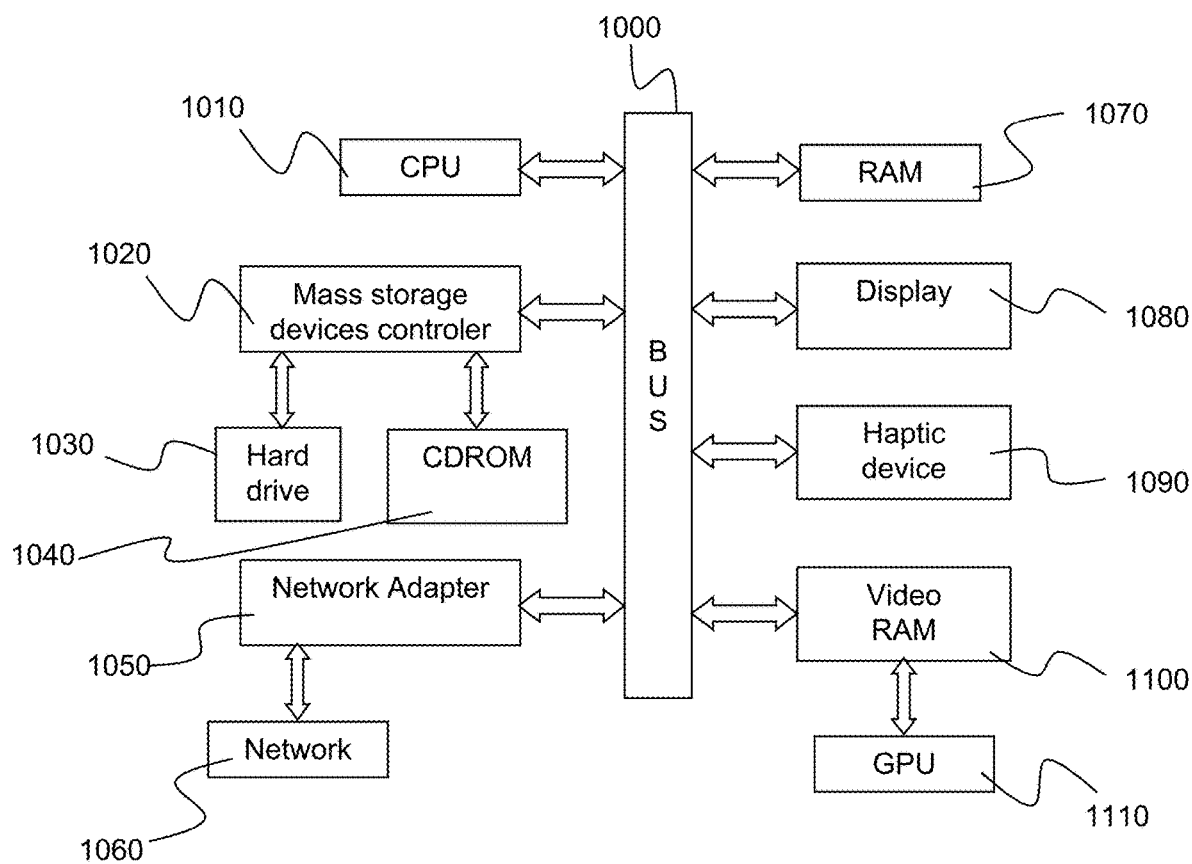
FIG. 9 shows an example of a computer system.

FIG. 9 shows an example of the system, wherein the system is a client computer system, e.g., a workstation of a user.

The client computer of the example comprises a central processing unit (CPU) 1010 connected to an internal communication BUS 1000, a random-access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

The invention claimed is:

1. A computer-implemented method for segmenting a 3D modeled object representing a mechanical assembly, the method comprising:
    obtaining the 3D modeled object;
    inputting a representation of the 3D modeled object to an abstraction neural network, the abstraction neural network outputting a first set of first primitives fitting the 3D modeled object, the first set consisting of a first number of first primitives; and
    determining, from the first set, one or more second sets each of respective second primitives, each second set consisting of a respective second number of respective second primitives, the second number being lower than the first number, the determining including:
    initializing a third set of third primitives as the first set;
    performing one or more iterations each comprising:
        obtaining the third set of third primitives,
        merging one or more subsets of third primitives together each into one respective single fourth primitive, thereby obtaining a fourth set of fourth primitives consisting of each single fourth primitive and each non-merged third primitive, and
        setting the third set of a next iteration as the fourth set of a current iteration; and
    setting the one or more second sets as one or more obtained fourth sets.

2. The method of claim 1, wherein the merging comprises determining the one or more subsets to be merged among a group of candidate subsets, said determining of the one or more subsets to be merged including, for each respective candidate subset of the group, a penalization of a merge cost of the respective candidate subset.

3. The method of claim 2, wherein the merging comprises determining the group of candidate subsets among candidate groups of subsets, said determining of the group of candidate subsets including, for each respective candidate group, a global penalization, for all subsets of the respective candidate group, of merge compatibilities each between the third primitives of a respective subset.

4. The method of claim 3, wherein the candidate groups of subsets consist of partitions of the third set each into pairs of third primitives, said determining of the group of candidate subsets including a minimum weight matching algorithm.

5. The method of claim 1, wherein the abstraction neural network comprises:
an encoder, wherein the encoder comprises a convolutional neural network, and/or the encoder is configured to take voxel grids as input, the representation of the 3D modeled object inputted to the abstraction neural network being according to a voxel grid format, and
three sub-networks configured to respectively output primitive size parameters, primitive positioning parameters and primitive orientation parameters, and, one additional sub-network configured to output primitive shape parameters, wherein at least one sub-network is each composed of fully connected layers.

6. The method of claim 1, wherein the one or more second sets comprise a plurality of second sets, the method further comprising one or more interactions each comprising:
selecting, upon user interaction, a single second set of the plurality of second sets; and
displaying, in real-time, a graphical representation of the selected second set.

7. The method of claim 1, the method further comprising:
automatically selecting a single fourth set, the selected single fourth set corresponding to an evolution of a merging reconstruction loss between successive iterations being higher than a threshold; and
marking the selected single fourth set.

8. The method of claim 1, wherein the abstraction neural network is trained in an unsupervised manner on a dataset comprising non-annotated 3D modeled objects each representing a respective mechanical assembly.

9. The method of claim 1, wherein the merging comprises inputting a representation of each subset to a merging neural network, the merging neural network outputting the respective single fourth primitive.

10. The method of claim 9, wherein the merging neural network comprises:
an encoder, wherein the encoder comprises a convolutional neural network, and/or the encoder is configured to take voxel grids and/or point clouds as input, the representation of each subset inputted to the merging neural network being respectively according to a voxel grid format or to a point cloud format, and
three sub-networks respectively configured to respectively output primitive size parameters, primitive positioning parameters and primitive orientation parameters, and, one additional sub-network configured to output primitive shape parameters, wherein at least one sub-network is each composed of fully connected layers.

11. The method of claim 1, wherein at least one of the abstraction neural network and the merging neural network is trained based on a respective training loss which penalizes a reconstruction loss, wherein the reconstruction loss is based on point cloud distance, the training loss of the abstraction neural network further penalizes an overlap loss and an area loss, and/or the training loss is equal to a weighted sum of the reconstruction loss, the overlap loss and the area loss.

12. A non-transitory computer readable medium having stored thereon a program that when executed by a computer causes the computer to implement the method for segmenting the 3D modeled object representing the mechanical assembly according to claim 1.

13. A device comprising:
a processor;
a non-transitory data storage medium having recorded thereon a program comprising instructions for segmenting a 3D modeled object representing a mechanical assembly that when executed by the processor causes the processor to be configured to:
obtain the 3D modeled object;
input a representation of the 3D modeled object to an abstraction neural network, the abstraction neural network outputting a first set of first primitives fitting the 3D modeled object, the first set consisting of a first number of first primitives; and
determine, from the first set, one or more second sets each of respective second primitives, each second set consisting of a respective second number of respective second primitives, the second number being lower than the first number,
wherein the processor is further configured to determine by being further configured to:
initialize a third set of third primitives as the first set;
perform one or more iterations each including the processor being configured to:
obtain the third set of third primitives,
merge one or more subsets of third primitives together each into one respective single fourth primitive, thereby obtaining a fourth set of fourth primitives consisting of each single fourth primitive and each non-merged third primitive, and
set the third set of a next iteration as the fourth set of a current iteration; and
set the one or more second sets as one or more obtained fourth sets.

14. The device of claim 13, wherein the processor is further configured to determine the one or more subsets to be merged among a group of candidate subsets, said determination of the one or more subsets to be merged including, for each respective candidate subset of the group, a penalization of a merge cost of the respective candidate subset.

15. The device of claim 14, wherein the processor is further configured to merge by being configured to determine the group of candidate subsets among candidate groups of subsets, said determination of the group of candidate subsets including, for each respective candidate group, a global penalization, for all subsets of the respective candidate group, of merge compatibilities each between the third primitives of a respective subset.

16. The device of claim 15, wherein the candidate groups of subsets consist of partitions of the third set each into pairs of third primitives, said determination of the group of candidate subsets including a minimum weight matching algorithm.

* * * * *